(12) United States Patent
Mertens

(10) Patent No.: US 6,847,430 B2
(45) Date of Patent: Jan. 25, 2005

(54) LITHOGRAPHIC APPARATUS AND DEVICE MANUFACTURING METHOD

(75) Inventor: Jeroen Johannes Sophia Maria Mertens, Duizel (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/354,153

(22) Filed: Jan. 30, 2003

(65) Prior Publication Data

US 2003/0197844 A1 Oct. 23, 2003

(30) Foreign Application Priority Data

Feb. 1, 2002 (EP) .............................................. 02250707

(51) Int. Cl.[7] ........................ G03B 27/52; G03B 27/42; G03B 27/54; G03B 27/32
(52) U.S. Cl. ............................ 355/30; 355/53; 355/67; 355/77
(58) Field of Search ............................ 355/67, 53, 30, 355/77; 250/492.1, 492.2; 137/264; 277/312

(56) References Cited

U.S. PATENT DOCUMENTS

| | | | |
|---|---|---|---|
| 4,989,031 A | | 1/1991 | Kamiya ........................ 355/30 |
| 5,971,009 A | * | 10/1999 | Schuetz et al. .............. 137/312 |
| 6,177,668 B1 | * | 1/2001 | Hager .......................... 250/282 |
| 6,252,648 B1 | * | 6/2001 | Hase et al. ..................... 355/53 |
| 6,268,904 B1 | * | 7/2001 | Mori et al. ..................... 355/53 |
| 6,288,769 B1 | | 9/2001 | Akagawa et al. .............. 355/30 |
| 6,335,787 B1 | * | 1/2002 | Nishi ............................ 355/67 |
| 6,522,384 B2 | * | 2/2003 | Miwa ............................ 355/30 |
| 6,538,716 B2 | * | 3/2003 | Mulkens et al. ............... 355/30 |
| 6,590,631 B2 | * | 7/2003 | Miwa et al. ................... 355/30 |
| 2002/0018190 A1 | | 2/2002 | Nogawa et al. ................ 355/30 |

FOREIGN PATENT DOCUMENTS

| | | |
|---|---|---|
| EP | 1098225 A2 | 5/2001 |
| EP | 1098226 A2 | 5/2001 |
| JP | 03097216 | 4/1991 |
| JP | 2001358056 | 12/2001 |
| WO | WO01/06548 | 1/2001 |

* cited by examiner

Primary Examiner—Alan Mathews
(74) Attorney, Agent, or Firm—Pillsbury Winthrop LLP

(57) ABSTRACT

In a lithographic projection apparatus, ingress of contaminants to a component is prevented by providing a first flow of purge gas through the inside of a first compartment encapsulating the component and a second flow of purge gas to an external surface of the compartment.

20 Claims, 4 Drawing Sheets

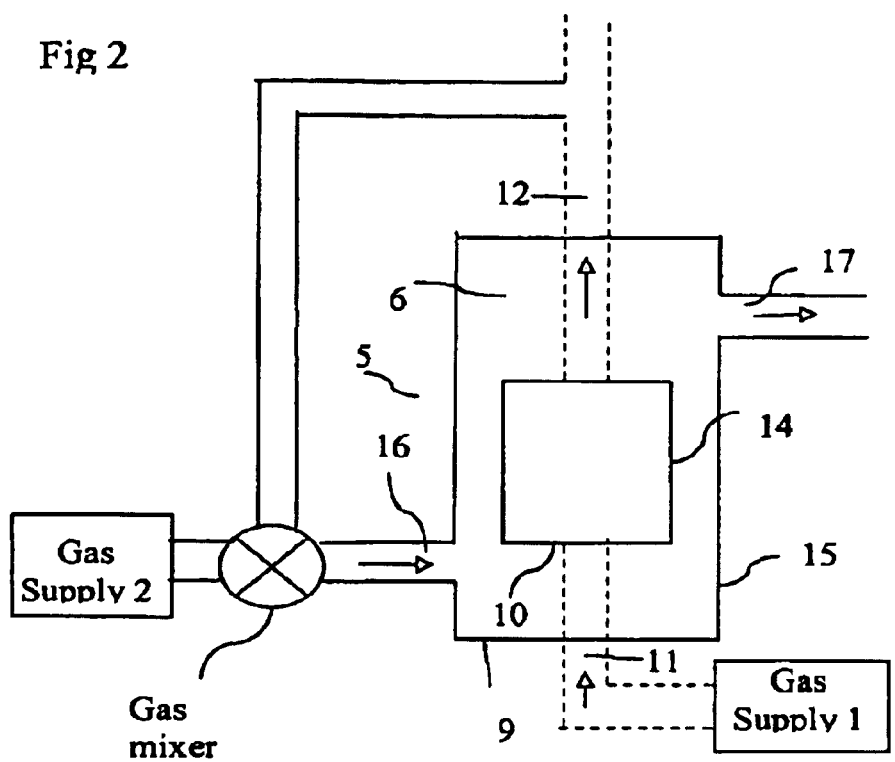
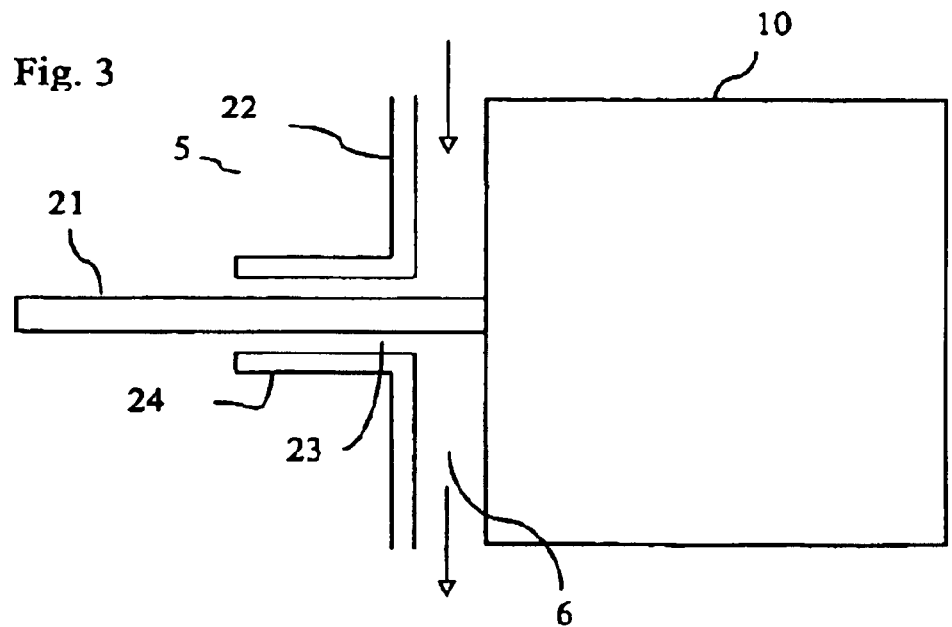

LITHOGRAPHIC APPARATUS AND DEVICE MANUFACTURING METHOD

RELATED APPLICATION

This application claims the benefit of priority to European Patent Application No. 02250707.3, filed Feb. 1, 2002, the contents of which are herein incorporated by reference.

BACKGROUND OF THE INVENTION

1. Field of the Invention

The present invention relates to a lithographic projection apparatus and a device manufacturing method.

2. Description of the Related Art

The term "patterning device" as here employed should be broadly interpreted as referring to device that can be used to endow an incoming radiation beam with a patterned cross-section, corresponding to a pattern that is to be created in a target portion of the substrate. The term "light valve" can also be used in this context. Generally, the pattern will correspond to a particular functional layer in a device being created in the target portion, such as an integrated circuit or other device (see below). An example of such a patterning device is a mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

Another example of a patterning device is a programmable mirror array. One example of such an array is a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind. In this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuators. Once again, the mirrors are matrix-addressable, such that addressed mirrors will reflect an incoming radiation beam in a different direction to unaddressed mirrors. In this manner, the reflected beam is patterned according to the addressing pattern of the matrix-addressable mirrors. The required matrix addressing can be performed using suitable electronics. In both of the situations described hereabove, the patterning device can comprise one or more programmable mirror arrays. More information on mirror arrays as here referred to can be seen, for example, from U.S. Pat. Nos. 5,296,891 and 5,523,193, and PCT publications WO 98/38597 and WO 98/33096. In the case of a programmable mirror array, the support structure may be embodied as a frame or table, for example, which may be fixed or movable as required.

Another example of a patterning device is a programmable LCD array. An example of such a construction is given in U.S. Pat. No. 5,229,872. As above, the support structure in this case may be embodied as a frame or table, for example, which may be fixed or movable as required.

For purposes of simplicity, the rest of this text may, at certain locations, specifically direct itself to examples involving a mask and mask table. However, the general principles discussed in such instances should be seen in the broader context of the patterning device as hereabove set forth.

Lithographic projection apparatus can be used, for example, in the manufacture of integrated circuits (IC's). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once. Such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as here described can be seen, for example, from U.S. Pat. No. 6,046,792.

In a known manufacturing process using a lithographic projection apparatus, a pattern (e.g. in a mask) is imaged onto a substrate that is at least partially covered by a layer of radiation-sensitive material (resist). Prior to this imaging, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. It is important to ensure that the overlay (juxtaposition) of the various stacked layers is as accurate as possible. For this purpose, a small reference mark is provided at one or more positions on the wafer, thus defining the origin of a coordinate system on the wafer. Using optical and electronic devices in combination with the substrate holder positioning device (referred to hereinafter as "alignment system"), this mark can then be relocated each time a new layer has to be juxtaposed on an existing layer, and can be used as an alignment reference. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

For the sake of simplicity, the projection system may hereinafter be referred to as the "lens." However, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel or preparatory steps may be carried out on one or more tables while one or more other tables are being used for exposures. Dual stage lithographic apparatus are described, for example, in U.S. Pat. No. 5,969,441 and WO 98/40791.

The optical elements of the apparatus described above, such as the projection lens for example, must be kept free of contaminants such as oxygen, moisture and hydrocarbons. Sources of contaminants include the ambient environment around the apparatus, components such as actuators within the apparatus, the resist, the radiation source and the mask. The contaminants may absorb the radiation leading to unacceptable losses and/or local variations in beam intensity. It is necessary therefore to ensure that the ingress of external contaminants to compartments containing contaminant sensitive components is minimized and that the penetration of contaminants, generated in proximity to or within these compartments, to such contaminant sensitive components is also minimized.

SUMMARY OF THE INVENTION

It is an aspect of the present invention to reduce the level of external contaminants reaching optical components and to remove internally generated contaminants.

This and other aspects are achieved according to the invention in a lithographic apparatus including a radiation system constructed and arranged to supply a projection beam of radiation; a support structure constructed and arranged to support a patterning device, the patterning device constructed and arranged to pattern the projection beam according to a desired pattern; a substrate table to hold a substrate; a projection system constructed and arranged to project the patterned beam onto a target portion of the substrate; a first compartment with a contaminant sensitive component within it; a first gas supply constructed and arranged to purge the interior of the first compartment with a first purge gas; and a second gas supply constructed and arranged to supply a flow of a second purge gas to an exterior surface of an enclosure defining the compartment.

This apparatus is advantageous since the purging of the exterior surface of the compartment removes much of the contaminants generated around the compartment and reduces the ingress of external contaminants to the component located within the compartment. Any leakage into the compartment will be mainly the clean purge gas. Purging the exterior surface of the compartment with the second gas supply ensures that the contaminant level within the compartment is even lower than in the region immediately surrounding the compartment and consequently very low.

In an embodiment of the present invention, a second compartment is provided, surrounding the first compartment, and the second gas supply purges the space between the first and second compartments. The enclosure of the second compartment provides an additional barrier to the ingress of external contaminants, further reducing the level of contaminants within the first compartment. Furthermore, by providing a defined space that requires purging, the amount of purge gas required is significantly reduced and the purge gas is prevented from interfering with other components outside the second compartment.

Preferably an opening, covered by the second gas flow, is provided in the enclosure of the second compartment and a link passes through the opening. This allows a mechanical connection and other utilities and controls to be provided to the first compartment without substantially increasing the contaminant level in the first compartment.

The second compartment may have an interface shield surrounding the opening and projecting into a second portion of the apparatus, external to the second compartment. This reduces the contaminant level within the second compartment by increasing the distance that contaminants must diffuse to pass through the opening. Consequently the contaminant level within the first compartment is also reduced.

In a further aspect of the present invention, a seal is provided between the interface shield mounted on the second compartment and the link passing through the opening. This reduces still further the ingress of contaminants from the second portion of the apparatus to the interior of the second compartment.

According to a second embodiment of the present invention, the external surface of the first compartment is purged by a curtain of purge gas or by a plurality of jets of purge gas directed at the external surface of the compartment. This obviates the need for a second compartment.

According to yet another aspect of the present invention the first compartment comprises an outlet exhausting the first purge gas after having purged the interior of the first compartment, the outlet generating an additional flow of purge gas to the exterior surface of the enclosure defining the first compartment. This outlet may or may not be connected to a gas mixer constructed and arranged to mix the first purge gas exhausted from the first compartment with the second purge gas and supply the gas mixture to the exterior surface of the enclosure defining the first compartment. By re-using the first purge gas the amount of purge gas required is even further reduced.

According to a further aspect of the invention there is provided a device manufacturing method including providing a substrate that is at least partially covered by a layer of radiation-sensitive material; providing a projection beam of radiation using a radiation system; using a patterning device to endow the projection beam with a pattern in its cross-section; projecting the patterned beam of radiation onto a target portion of the layer of radiation-sensitive material; providing a first flow of purge gas to purge the interior of a compartment containing a contaminant sensitive component of device manufacturing apparatus; and providing a second flow of purge gas to an exterior surface of the enclosure defining the compartment in order to purge the exterior surface.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid crystal display panels, thin film magnetic heads, etc. n will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm), as well as particle beams, such as ion beams or electron beams.

BRIEF DESCRIPTION OF THE DRAWINGS

Embodiments of the invention will now be described, by way of example only, with reference to the accompanying schematic drawings in which:

FIG. 2 depicts a compartment according to the present invention in which the ingress of external contaminants is reduced and internal contaminants are removed;

FIG. 3 depicts a compartment according to the present invention with a link to a component outside a second compartment encompassing the first compartment 10 in which the ingress of external contaminants is reduced and internal contaminants are removed;

In the Figures, corresponding reference symbols indicate corresponding parts.

DETAILED DESCRIPTION

Figure 1:
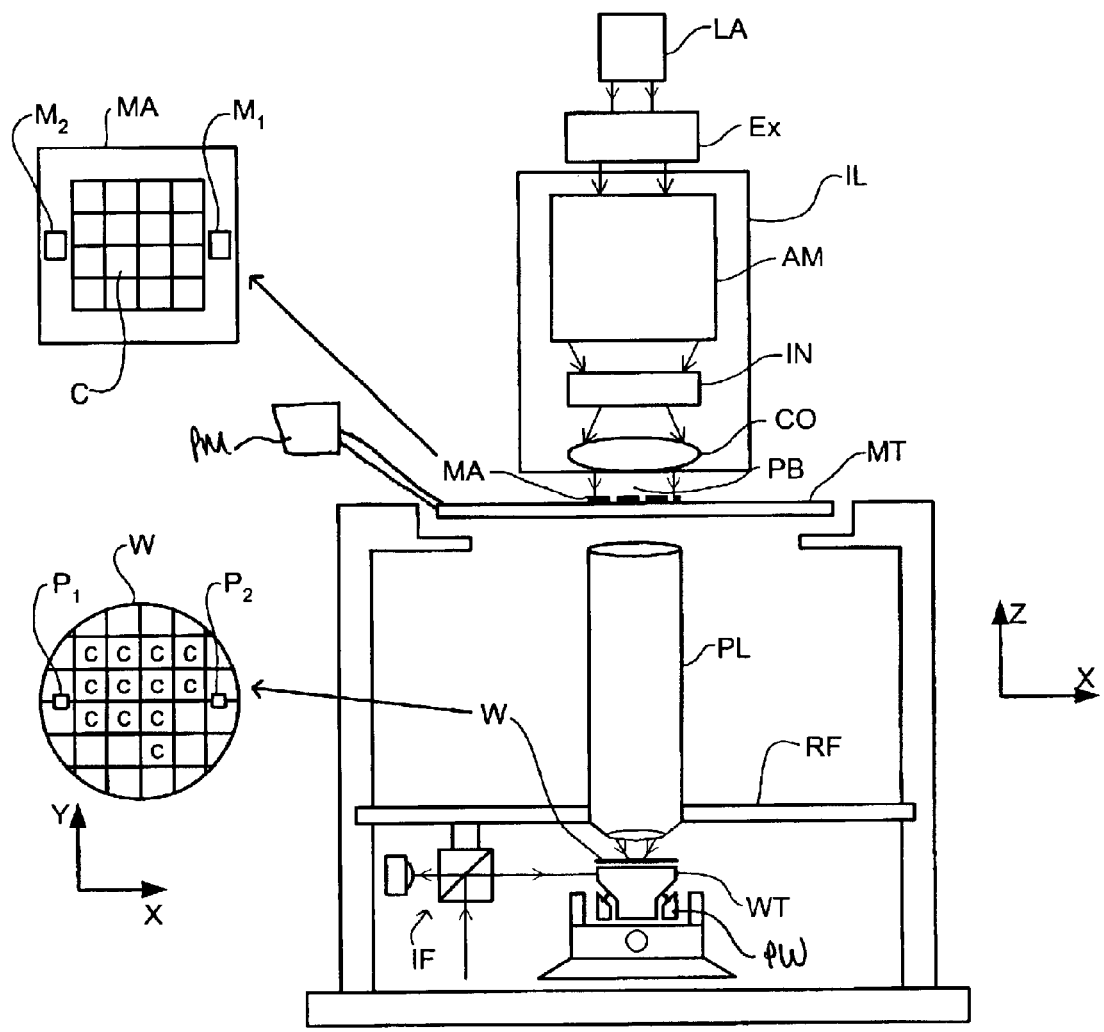
FIG. 1 depicts a lithographic projection apparatus according to an embodiment of the invention.

FIG. 1 schematically depicts a lithographic projection apparatus 1 according to an embodiment of the invention. The apparatus includes a radiation system Ex, IL constructed and arranged to supply a projection beam PB of radiation (e.g. UV or EUV radiation, such as, for example, generated by an excimer laser operating at a wavelength of 248 nm, 193 nm or 157 nm, or by a laser-fired plasma source operating at 13.6 nm). In this embodiment, the radiation system also comprises a radiation source LA. The apparatus also includes a first object (mask) table MT provided with a mask holder constructed and arranged to hold a mask MA (e.g. a reticle), and connected to a first positioning device PM to accurately position the mask with respect to a projection system or lens PL; a second object (substrate) table WT provided with a substrate holder constructed and arranged to hold a substrate W (e.g. a resist-coated silicon wafer), and connected to a second positioning device PW to accurately position the substrate with respect to the projection system or lens PL. The projection system or lens PL (e.g. a quartz and/or $CaF_2$ lens system or a refractive or catadioptric system, a mirror group or an array of field deflectors) is constructed and arranged to image an irradiated portion of the mask MA onto a target portion C (e.g. comprising one or more dies) of the substrate W. The projection system PL is supported on a reference frame RF. As here depicted, the apparatus is of a transmissive type (i.e. has a transmissive mask). However, in general, it may also be of a reflective type, (e.g. with a reflective mask). Alternatively, the apparatus may employ another kind of patterning device, such as a programmable mirror array of a type as referred to above.

The source LA (e.g. a UV excimer laser, an undulator or wiggler provided around the path of an electron beam in a storage ring or synchrotron, a laser-produced plasma source, a discharge source or an electron or ion beam source) produces a beam PB of radiation. The beam PB is fed into an illumination system (illuminator) IL, either directly or after having traversed a conditioner, such as a beam expander Ex, for example. The illuminator IL may comprise an adjusting device AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors). The latter scenario is often the case when the source LA is an excimer laser. The present invention encompasses both of these scenarios. In particular, the present invention encompasses embodiments wherein the radiation system Ex, IL is adapted to supply a projection beam of radiation having a wavelength of less than about 170 nm, such as with wavelengths of 157 mm, 126 nm and 13.6 nm, for example.

The beam PB subsequently intercepts the mask MA, which is held on the mask table MT. Having traversed the mask MA, the beam PB passes through the lens PL, which focuses the beam PB onto a target portion C of the substrate W. With the aid of the second positioning device PW and interferometer IF, the substrate table WT can be moved accurately, e.g. so as to position different target portions C in the path of the beam PB. Similarly, the first positioning device PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning). However, in the case of a wafer stepper (as opposed to a step and scan apparatus) the mask table MT may just be connected to a short stroke actuator, or may be fixed. The mask MA and the substrate W may be aligned using mask alignment marks $M_1$, $M_2$ and substrate alignment marks $P_1$, $P_2$.

The depicted apparatus can be used in two different modes:

1. In step mode, the mask table MT is kept essentially stationary, and an entire mask image is projected at once, i.e. a single "flash," onto a target portion C. The substrate table WT is then shifted in the X and/or Y directions so that a different target portion C can be irradiated by the beam PB;

2. In scan mode, essentially the same scenario applies, except that a given target portion C is not exposed in a single "flash." Instead, the mask table MT is movable in a given direction (the so-called "scan direction", e.g. the Y direction) with a speed v, so that the projection beam PB is caused to scan over a mask image. Concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

FIG. 2 shows a first compartment 10 of the apparatus, containing a component that is sensitive to contaminants. Such a component may be, for example, the projection system, the illumination system or a component (e.g. an optical element) within the projection system or illumination system. In this embodiment, the first compartment 10 is located in a second compartment 9, defined by a barrier 15. The space between an enclosure 14 defining the first compartment 10 and the barrier 15 of the second compartment 9 defines a first portion 6 of the apparatus outside the first compartment 10. The barrier 15 separates the first portion 6 of the apparatus from a second portion 5 of the apparatus. Depending on the component to be screened from contaminants, the first and second portions 6, 5 may, for example, be both located in the projection system or, for example, the first compartment 10 may be the projection system or some other component. Similarly either one of the compartments may be the Projection Optics Box (POB) which houses the projection system.

The inside of the first compartment 10 is purged by a flow of gas provided through an inlet 11 and exhausted through an outlet 12. Separately, the external surface of the first compartment 10 is purged by a flow of gas provided through an inlet 16 and exhausted through an outlet 17. The combination of the barrier 15 and the flow of gas through the first portion 6 of the apparatus ensures that the contaminant level in the first portion 6 of the apparatus (i.e. within the second compartment) is significantly lower than that in the second portion of the apparatus 5. Contaminants external to the first portion 6 of the apparatus (such as contaminants from the external environment of the apparatus and from components located in the second portion 5 of the apparatus) are restricted from passing through the barrier 15. Contaminants that do leak through the barrier 15 and those generated within the first portion 6 of the apparatus are flushed out by the purge gas through the outlet 17. However, the required maximum contamination level in the optical component may be lower than that attainable in the first portion 6 of the apparatus. Therefore the component is contained within the enclosure 14 that defines the first compartment 10. This enclosure prevents or significantly reduces the ingress of contaminants from the first portion 6 of the apparatus to the inside of compartment 10 and thence to the optical component. Furthermore any contaminants that do leak through the enclosure 14 and any contaminants generated within the first compartment 10 are flushed out by the purge gas through the outlet 12.

The purge gas used to flush both the first compartment 10 and the second compartment 9 are preferably transparent to the radiation used. Suitable examples of gases that may be used are gases from the group comprising $N_2$, He, Ar, Kr, Ne, Xe or a mixture of two or more of these. In an exemplary embodiment of the present invention, the inside of the first compartment 10 is purged with He gas and the outside of the first compartment 10, namely the first portion 6 of the apparatus, is purged with $N_2$ gas. In any case, the oxygen and water vapor content of the gases used for purging should be minimized and preferably substantially zero. A suitable limit for the water vapor content is less than 0.5 ppm and a suitable limit for the oxygen content is less than 1 ppm.

The contaminant fraction (i.e. the proportion of contaminants within the gas) must be lower in the purge gas used to purge the inside of the first compartment 10 than in the purge gas used to purge the outside of the first compartment 10. However the lower the required contaminant fraction of a purge gas, the greater the cost of producing it. Consequently it is desirable to minimize the use of the cleanest purge gas, i.e. that suitable for use in purging the inside of the first compartment 10. Preferably, therefore, the purge gas supplies for purging the interior and the exterior of the first compartment 10 are separate. However in some circumstances it may be preferable to minimize the complexity of the apparatus. In such circumstances the purge gas supply for purging the inside and the outside of the first compartment 10 may be combined. In any case, the contaminant fraction of both purge gases will be lower than the contaminant fraction of the air in the ambient environment surrounding the second compartment.

As the requirements for purging the exterior of the first compartment 10 are less stringent than those for purging the interior, it may be envisaged to re-use the first purge gas exhausted through outlet 12 in purging the exterior of said first compartment 10. To this end the outlet 12 may be connected to a gas mixer that mixes the first purge gas exhausted from the first compartment 10 with the second purge gas and supplies the gas mixture to the exterior of the first compartment 10, or the first purge gas may be supplied directly to the exterior of the first compartment 10.

The first compartment 10 typically requires a link between itself and a part of the apparatus located within the second portion of the apparatus. FIG. 3 shows the provision of such a link while minimizing the ingress of contaminants to the first portion 6 of the apparatus. The first compartment 10 is located within the first portion 6 of the apparatus and separated from the second portion 5 of the apparatus by a barrier 22. As described above, both the first compartment 10 and the first portion 6 of the apparatus are purged by a flow of gas.

The barrier 22 has an opening 23 through which a link 21 passes to connect the first compartment 10 to a second component of the apparatus (not shown) in the second portion 5 of the apparatus. The link may provide a mechanical connection, for example to provide positioning of the first compartment 10 using an actuator located in the second portion 5 of the apparatus, a utility link, for example to provide electrical power or purge gas to the first compartment 10, or a control link.

As shown in FIG. 3, the barrier 22 has a an interface shield 24 surrounding the opening 23 and extending into the second portion 5 of the apparatus. The interface shield 24 increases the distance that any contaminants must diffuse to pass from the second portion 5 of the apparatus to the first portion 6 of the apparatus, thereby reducing the level of contamination in the first portion. It may be substantially cylindrical.

Figure 4:
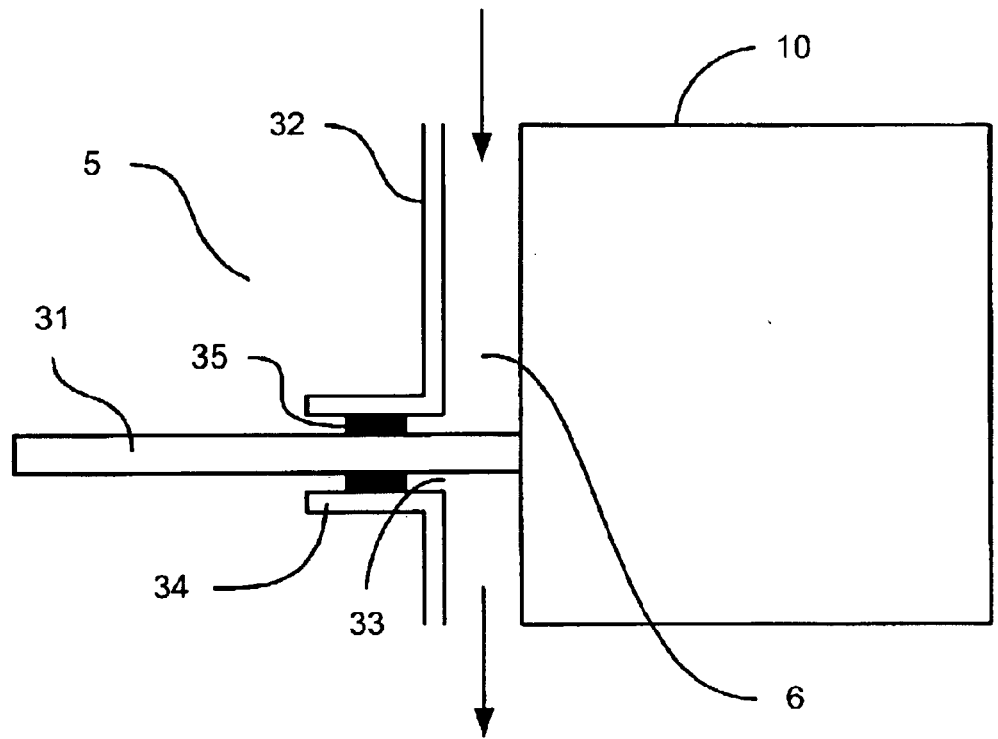
FIG. 4 depicts a variation of the component of FIG. 3.

FIG. 4 shows a variation of the arrangement described above in relation to FIG. 3. The first compartment 10, located in the first portion 6 of the apparatus, is linked to the second portion 5 of the apparatus by a link 31 that passes through an opening 33 in barrier 32 which separates the first and second portions of the apparatus. A seal 35 is provided between the link 31 and the interface shield 34. The seal 35 further reduces the leakage of the contaminants from the second portion 5 of the apparatus into the first portion 6 of the apparatus. It is important that the seal 35 is made of a soft rubber having a low stiffness, such as celrubber, or a rubber with similar stiffness to reduce the transmission of vibrations between the components of the apparatus.

In addition to reducing the ingress of contaminants to the first portion 6 of the apparatus, the use of the seal 35 will reduce the outflow of purge gas from the first portion 6 of the apparatus to the second portion of the apparatus. This may be important, for example, if the purge gas used for the first portion 6 of the apparatus is $N_2$ as this can interfere with the performance of interferometers located in the second portion 5 of the apparatus.

Figure 5:
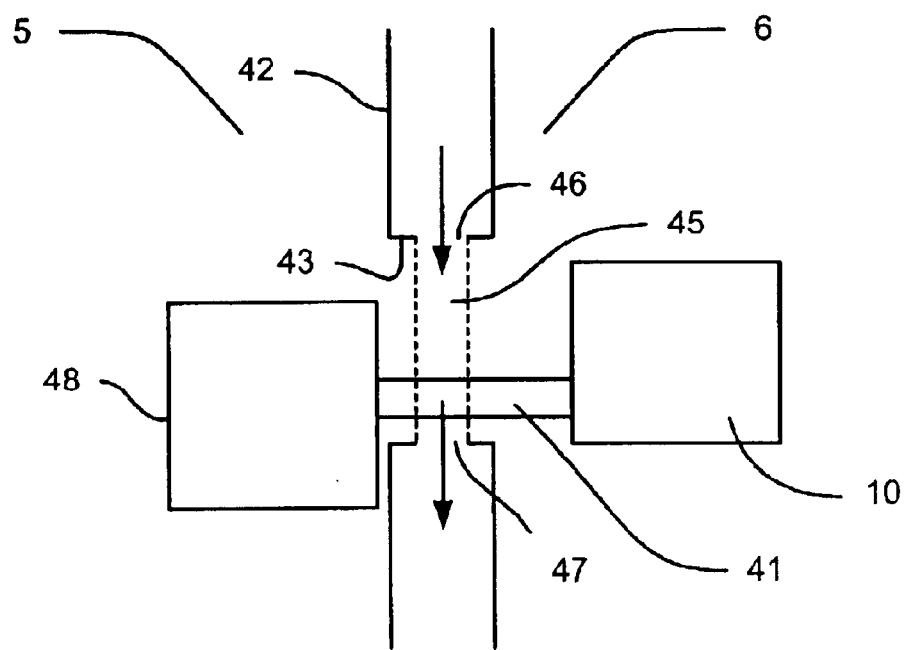
FIG. 5 depicts a further variation of the component of FIG. 3.

FIG. 5 shows a further variation of the arrangements described above in relation to FIGS. 3 and 4. This arrangement may be especially useful if the required travel, perpendicular to the barrier, of the link is relatively large. The first compartment 10, located in the first portion 6 of the apparatus, is linked to a component 48 of the apparatus located in the second portion 5 of the apparatus. The barrier 42, separating the first and second portions of the apparatus has an opening 43 through which the link 41 passes. The opening 43 is covered by a curtain 45 of purge gas. The curtain 45 of purge gas is provided by an outlet 46 on one side of the opening 43 and extracted by an extractor through an outlet 47 on an opposite side of the opening. The curtain 45 of purge gas substantially reduces the contamination that diffuses through the opening. The gas curtain may be provided either in addition to the gas used to purge the first portion 6 of the apparatus or may be part of the supply to purge the first portion 6 of the apparatus.

It should be appreciated that apparatus of the type described above will be operated in a clean room environment. Such a clean room should not be regarded as a second compartment as described above nor should any airflow within such a room be regarded as the second supply of purge gas. The air in such clean rooms contains oxygen and water vapor and is therefore not suitable as a purging gas in the context of the present application.

Figure 6:
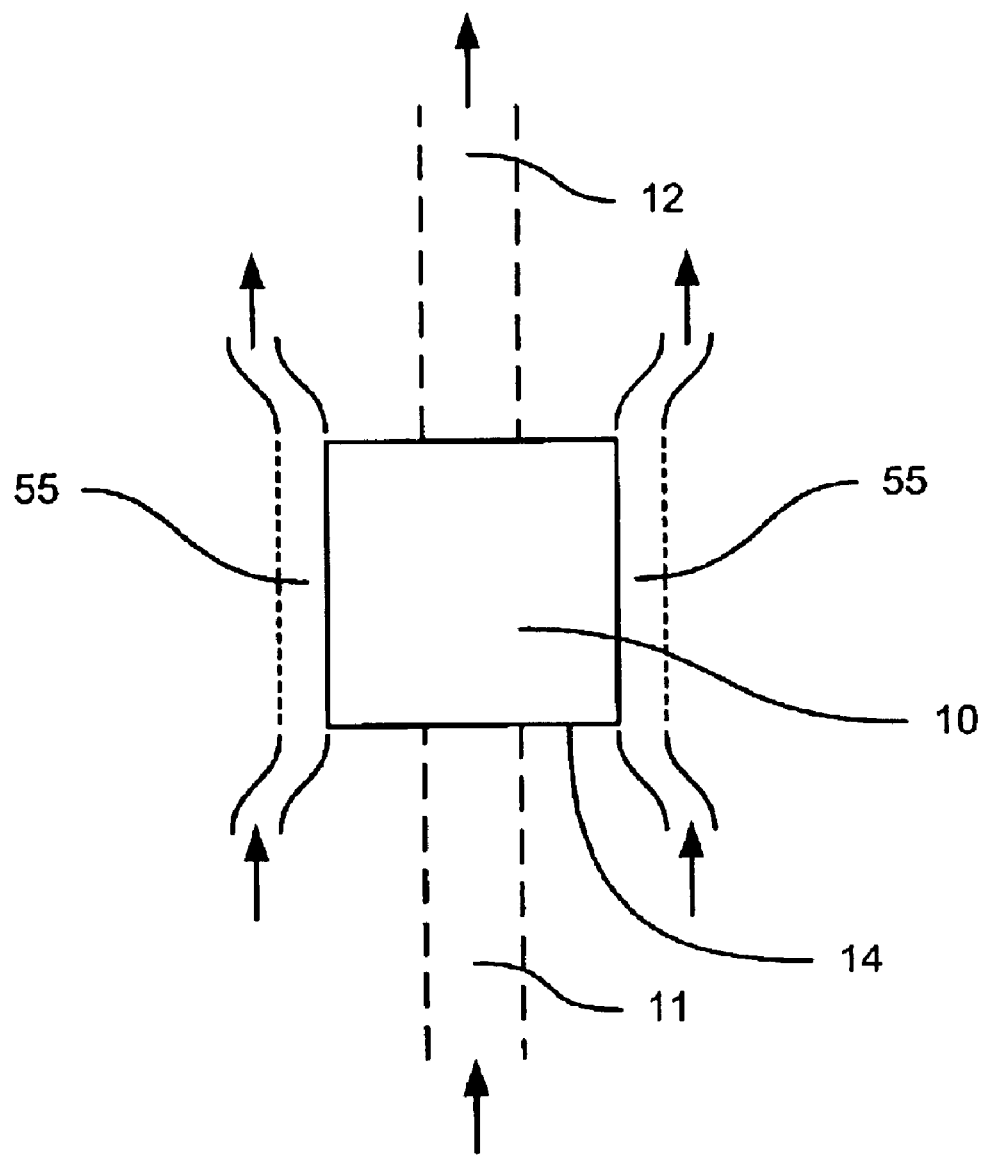
FIG. 6 depicts an alternative compartment according to the present invention in which the ingress of external contaminants is reduced and internal contaminants are removed.

In an alternative embodiment, shown in FIG. 6, the external surface of the first compartment 10 is purged using curtains 55 of purge gas (only two shown). A second compartment, defining a portion of the apparatus that is flushed is not required. As before, the inside of the first compartment 10 is purged. In an alternative of this embodiment of the invention, the external surface of the first compartment 10 is purged by a plurality of jets of purge gas directed at its external surface.

While specific embodiments of the invention have been described above, it will be appreciated that the invention may be practiced otherwise than as described. The description is not intended to limit the invention.

What is claimed is:

1. A lithographic projection apparatus, comprising:

a radiation system constructed and arranged to provide a projection beam of radiation;

a support structure constructed and arranged to support a patterning device, the patterning device constructed and arranged to pattern the projection beam according to a desired pattern;

a substrate table to hold a substrate;

a projection system constructed and arranged to project the patterned beam onto a target portion of the substrate;

a first compartment with a contaminant sensitive component within it;

a first gas supply constructed and arranged to purge the interior of the first compartment with a first purge gas; and a second gas supply constructed and arranged to supply a flow of a second purge gas to an exterior surface of an enclosure defining the first compartment.

2. An apparatus according to claim 1, wherein the second purge gas has a lower contaminant fraction than air surrounding the first compartment.

3. An apparatus according to claim 1, wherein the first compartment at least partially surrounds the projection system.

4. An apparatus according to claim 1, further comprising a second compartment surrounding the first compartment, wherein the second gas supply is constructed and arranged to purge the space between the first and second compartments.

5. An apparatus according to claim 4, further comprising:

an opening in the second compartment; and a link passing through the opening, wherein said link provides a connection between the first compartment and a component located outside the second compartment.

6. An apparatus according to claim 5, wherein the second compartment further comprises an interface shield surrounding said opening and extending from the second compartment.

7. An apparatus according to claim 6, further comprising a seal between the link and the interface shield.

8. An apparatus according claim 5, wherein the second compartment comprises a gas outlet on one side of the opening and a gas extractor on an opposite side of the opening, thereby covering the opening with a gas curtain.

9. An apparatus according to claim 1, wherein the second gas supply is constructed and arranged to provide a curtain of purge gas across at least one face of the first compartment.

10. An apparatus according to claim 1, wherein said second gas supply provides a plurality of jets of purge gas close to at least one face of the first compartment.

11. An apparatus according to claim 1, wherein the first compartment comprises an outlet exhausting the first purge gas after having purged the interior of the first compartment, said outlet generating an additional flow of purge gas to the exterior surface of the enclosure defining the first compartment.

12. An apparatus according to claim 11, wherein the outlet is connected to a gas mixer constructed and arranged to mix the first purge gas exhausted from the first compartment with the second purge gas and supply the gas mixture to the exterior surface of the enclosure defining the first compartment.

13. An apparatus according to claim 1, wherein the first or second gas supply is constructed and arranged to supply a gas from the group consisting of $N_2$, He, Ar, Kr, Ne, Xe or a mixture of two or more of these.

14. A device manufacturing method, comprising:

projecting a patterned beam of radiation onto a target portion of a layer of radiation-sensitive material disposed on a substrate;

providing a first flow of purge gas with a first gas supply to purge the interior of a compartment containing a contaminant sensitive component of a device manufacturing apparatus; and providing a second flow of purge gas with a second gas supply to an exterior surface of an enclosure defining the compartment in order to purge the exterior surface.

15. A device manufacturing method according to claim 14, wherein the first purge gas has a contaminant fraction lower than that of the second purge gas.

16. A lithographic projection apparatus comprising:

a radiation system constructed and arranged to provide a beam of radiation;

a support structure constructed and arranged to support a patterning device, the patterning device constructed and arranged to pattern the beam of radiation according to a desired pattern;

a substrate table to hold a substrate;

a projection system constructed and arranged to project the patterned beam of radiation onto a target portion of the substrate;

a first compartment with a contaminant sensitive component within it;

a first gas supply constructed and arranged to purge the interior of the first compartment with a first purge gas; and a second gas supply constructed and arranged to supply a flow of a second purge gas to an exterior surface of an enclosure defining the first compartment, wherein the first purge gas has a contaminant fraction lower than that of the second purge gas.

17. A lithographic projection apparatus according to claim 16 wherein the first purge gas is different from the second purge gas.

18. A lithographic projection apparatus according to claim 16, further comprising a gas mixer configured to mix the first purge gas exhausted from the first compartment with the second purge gas and to supply a mixture of these gases to the exterior surface of the enclosure defining the first compartment.

19. A lithographic projection apparatus according to claim 16, wherein the first compartment at least partially surrounds the projection system.

20. A lithographic projection apparatus according to claim 16, further comprising a second compartment, wherein the second gas supply is constructed and arranged to purge the space between the first and the second compartment.

* * * * *